United States Patent
Kanno et al.

(10) Patent No.: US 8,037,891 B2
(45) Date of Patent: Oct. 18, 2011

(54) TWO-FLUID NOZZLE FOR CLEANING SUBSTRATE AND SUBSTRATE CLEANING APPARATUS

(75) Inventors: Itaru Kanno, Chiyoda-ku (JP); Yusaku Hirota, Chiyoda-ku (JP); Kenji Sekiguchi, Nirasaki (JP); Hiroshi Nagayasu, Tosu (JP); Shouichi Shimose, Hikami-gun (JP)

(73) Assignee: Tokyo Electron Limited, Tokyo (JP)

( * ) Notice: Subject to any disclaimer, the term of this patent is extended or adjusted under 35 U.S.C. 154(b) by 801 days.

(21) Appl. No.: 10/591,474

(22) PCT Filed: Mar. 9, 2005

(86) PCT No.: PCT/JP2005/004072
§ 371 (c)(1),
(2), (4) Date: Sep. 1, 2006

(87) PCT Pub. No.: WO2005/086214
PCT Pub. Date: Sep. 15, 2005

(65) Prior Publication Data
US 2007/0141849 A1  Jun. 21, 2007

(30) Foreign Application Priority Data
Mar. 9, 2004 (JP) .................................. 2004-066392

(51) Int. Cl.
*B08B 3/04* (2006.01)
(52) U.S. Cl. .................. 134/95.3; 134/94.1; 134/95.1; 134/144; 134/902
(58) Field of Classification Search .................. 134/94.1, 134/95.1, 95.2, 95.3, 144, 157, 902
See application file for complete search history.

(56) References Cited

U.S. PATENT DOCUMENTS
3,315,611 A   4/1967   Thompson
(Continued)

FOREIGN PATENT DOCUMENTS
DE    197 40 996 A1   6/1998
(Continued)

OTHER PUBLICATIONS
Machine Translation of JP 2001252604 to Tateyama et al., Sep. 2001.*
(Continued)

*Primary Examiner* — Joseph L Perrin
*Assistant Examiner* — Benjamin Osterhout
(74) *Attorney, Agent, or Firm* — Smith, Gambrell & Russell, LLP

(57) ABSTRACT

An object of the present is to uniform particle diameters and speeds of liquid droplets in a two-fluid nozzle for cleaning substrates which mixes gas and liquid internally and injects liquid droplets with gas so as to clean a substrate. The two-fluid nozzle for cleaning substrates has a gas supply passage for supplying gas, a liquid supply passage for supplying liquid, and a lead-out passage for leading out internally-formed liquid droplets, wherein an injection port for injecting liquid droplets to the outside is formed at the front end of the lead-out passage, and wherein a cross-sectional area Sb of the injection port is formed smaller than a cross-sectional area Sa of the lead-out passage, and a cross sectional area Sc of an exit of the gas supply passage is formed smaller than the cross-sectional area Sa of the lead-out passage.

11 Claims, 7 Drawing Sheets

U.S. PATENT DOCUMENTS

| | | | |
|---|---|---|---|
| 4,511,087 A | 4/1985 | Matsumoto | |
| 5,014,790 A | 5/1991 | Papavergos | |
| 5,918,817 A | 7/1999 | Kanno et al. | |
| 6,253,963 B1* | 7/2001 | Tachibana | 222/129.1 |
| 2003/0079764 A1 | 5/2003 | Hirose et al. | |
| 2003/0178047 A1* | 9/2003 | Hirae | 134/26 |
| 2004/0031503 A1* | 2/2004 | Eitoku | 134/2 |
| 2004/0206378 A1* | 10/2004 | Okuda et al. | 134/56 R |

FOREIGN PATENT DOCUMENTS

| | | |
|---|---|---|
| EP | 0 314 354 | 5/1989 |
| JP | 49-101916 | 9/1974 |
| JP | 59-179259 | 10/1984 |
| JP | 561516 | 10/1991 |
| JP | 5-63658 | 8/1993 |
| JP | 7-116561 | 5/1995 |
| JP | 10-156229 | 6/1998 |
| JP | 2001-252604 | 9/2001 |
| JP | 2003-197597 | 7/2003 |
| JP | 2003-203892 | 7/2003 |

OTHER PUBLICATIONS

Supplementary European Search Report for Application No. EP 05 72 0344.

Notification of Transmittal of Translation of the International Preliminary Report on Patentability (Form PCT/IB/338)—PCT/JP2005/004072, dated Jan. 2004.

PCT International Preliminary Report on Patentability (Form PCT/IB/373)—PCT/JP2005/004072, dated Jan. 2004.

Translation of PCT Written Opinion of the International Searching Authority—(Form PCT/ISA/237)—PCT/JP2005/004072, dated Jan. 2004.

Japanese Office Action issued on Jul. 7, 2009 for Japanese Patent Application No. 2005-064781 with English translation.

* cited by examiner

TWO-FLUID NOZZLE FOR CLEANING SUBSTRATE AND SUBSTRATE CLEANING APPARATUS

TECHNICAL FIELD

The present invention relates to a two-fluid nozzle for cleaning substrates used for removing contaminants adhering on the surface of a semiconductor substrate or the like for example and a substrate cleaning apparatus having the two-fluid nozzle for cleaning substrates.

BACKGROUND ART

In a manufacturing process of a semiconductor device for example, there is used a substrate cleaning apparatus for cleaning a semiconductor wafer (hereinafter, referred to as a wafer) with a cleaning solution such as a chemical solution, pure water or the like to remove contamination of particles, organic contaminants, and metal impurities adhering on the wafer. As an example of such a substrate cleaning apparatus, one that uses a two-fluid nozzle to inject a cleaning solution in a liquid drop form to the surface of a wafer is known.

Conventionally, as a two-fluid nozzle for cleaning substrates, an internal mixing type to form liquid droplets by mixing gas and liquid inside the nozzle and an external mixing type to form liquid droplets by mixing gas and liquid outside the nozzle are known (for example, refer to Patent Document 1). Also, as an example of the internal mixing type, one that allows internally-formed liquid droplets and gas to pass through a straight tube so as to accelerate the liquid droplets and inject them into the air at a sufficient speed is proposed (for example, refer to Patent Document 2).

[Patent Document 1] Japanese Patent Application Laid-open No. 2003-197597

[Patent Document 2] Patent Publication No. 3315611

DISCLOSURE OF THE INVENTION

Problems to be Solved by the Invention

However, the conventional two-fluid nozzle for cleaning substrates generates a large dispersion in particle diameters of liquid droplets, having a risk that large liquid droplets are injected to the surface of a wafer to damage a minute pattern formed on the surface of the wafer. Particularly, in a case of the internal mixing type nozzle having a straight tube for accelerating liquid droplets, there is a problem that, while liquid droplets pass through the straight tube, small liquid droplets converge and form large liquid droplets. Also, it is known that the larger the number of liquid droplets to be injected, the higher the contaminant removing performance, but there is a problem that, if the liquid droplets are not sufficiently atomized or the liquid droplets converge to form large liquid droplets, the number of liquid droplets becomes small and the contaminant removing performance decreases. Also, when the flow rate of gas is increased to accelerate the liquid droplets at a high speed in order to increase the contaminant removing performance, large liquid droplets are injected also at a high speed, thereby damaging the surface of a wafer. Accordingly, there has been a limit to improve the contaminant removing performance.

Moreover, in the internal mixing type nozzle, there is a problem of having large dispersion in injection speed of liquid droplets. High speed liquid droplets have a risk of damaging the surface of a wafer. Further, low-speed liquid droplets have a problem of presenting low contaminant removing performance.

An object of the present invention is to provide a two-fluid nozzle for cleaning substrates which can uniform particle diameters and speeds of liquid droplets, and a substrate cleaning apparatus which can favorably clean a substrate using such a two-fluid nozzle for cleaning substrates.

Means For Solving The Problems

In order to achieve the above object, according to the present invention, there is provided a two-fluid nozzle for cleaning substrates which mixes gas and liquid internally and injects liquid droplets with gas so as to clean a substrate, which has a gas supply passage for supplying gas, a liquid supply passage for supplying liquid, and a lead-out passage for leading out internally-formed liquid droplets, wherein an injection port for injecting liquid droplets to the outside is formed at the front end of the lead-out passage, and wherein a cross-sectional area Sb of the injection port is formed smaller than a cross-sectional area Sa of the lead-out passage, and a cross-sectional area Sc of an exit of the gas supply passage is formed smaller than the cross-sectional area Sa of the lead-out passage.

A ratio Sa:Sb between the cross-sectional area Sa of the lead-out passage and the cross-sectional area Sb of the injection port may be 1:0.25 to 0.81. The cross-sectional area Sc of the exit of the gas supply passage may be formed equal to the cross-sectional area Sb of the injection port or smaller than the cross-sectional area Sb of the injection port. A ratio Sb:Sc between the cross-sectional area Sb of the injection port and the cross-sectional area Sc of the exit of the gas supply passage may be 1:0.16 to 0.87. The cross-sectional area Sc of the exit of the gas supply passage may be 1.13 mm$^2$ to 6.16 mm$^2$. The cross-sectional area Sc of the exit of the gas supply passage may be 1.77 mm$^2$ to 4.91 mm$^2$. The lead-out passage may be formed in a straight shape, and the cross-sectional area Sa of the lead-out passage may be constant. A length L1 of the lead-out passage may be 10 mm to 90 mm. A length L2 of the injection port may be 30 mm or shorter.

The two-fluid nozzle for cleaning substrates according to the present invention may have, for example, a liquid introduction passage in an annular shape surrounding the gas supply passage, and may have a structure such that the gas supply passage is arranged coaxially with the lead-out passage, the liquid supply passage is opened on an outer peripheral face of the liquid introduction passage, a taper portion is formed with a diameter which gets smaller toward a front end side in the liquid introduction passage, the taper portion is opened between the gas supply passage and the lead-out passage, and gas supplied from the gas supply passage and liquid introduced from the liquid introduction passage are mixed to form liquid droplets and the liquid droplets are lead out via the lead-out passage. The injection port may be formed with a vertical cross-sectional shape of an exit side periphery having a right angle or an acute angle.

Further, according to the present invention, there is provided a substrate cleaning apparatus which has the above-described two-fluid nozzle for cleaning substrates, a spin chuck for holding a substrate substantially horizontally, and a drive mechanism for moving the two-fluid nozzle for cleaning substrates above the substrate.

Effect Of The Invention

According to the present invention, by providing an injection port at the front end of a lead-out passage and allowing liquid droplets to pass through the injection port, the liquid droplets can be atomized sufficiently. In middle of the lead-out passage, even when a large liquid drop is formed on the inner wall of the lead-out passage, it is re-atomized in the injection port, and thus particle diameters of liquid droplets are uniformed. Further, by making respective diameters of the lead-out passage, the injection port, a liquid supply passage, and a gas supply passage with appropriate sizes, liquid and gas can be mixed at an appropriate flow rate to sufficiently atomize and inject liquid droplets. By making the lead-out passage and the injection port with appropriate lengths, sufficiently atomized liquid droplets can be injected at an appropriate speed. Therefore, contaminant removing performance of a two-fluid nozzle for cleaning substrates can be improved. Furthermore, speeds of liquid droplets can be uniformed. Further, by a substrate cleaning apparatus according to the present invention, the contaminant removing performance can be improved without damaging the surface of a substrate.

EXPLANATION OF CODES

Figure 1:
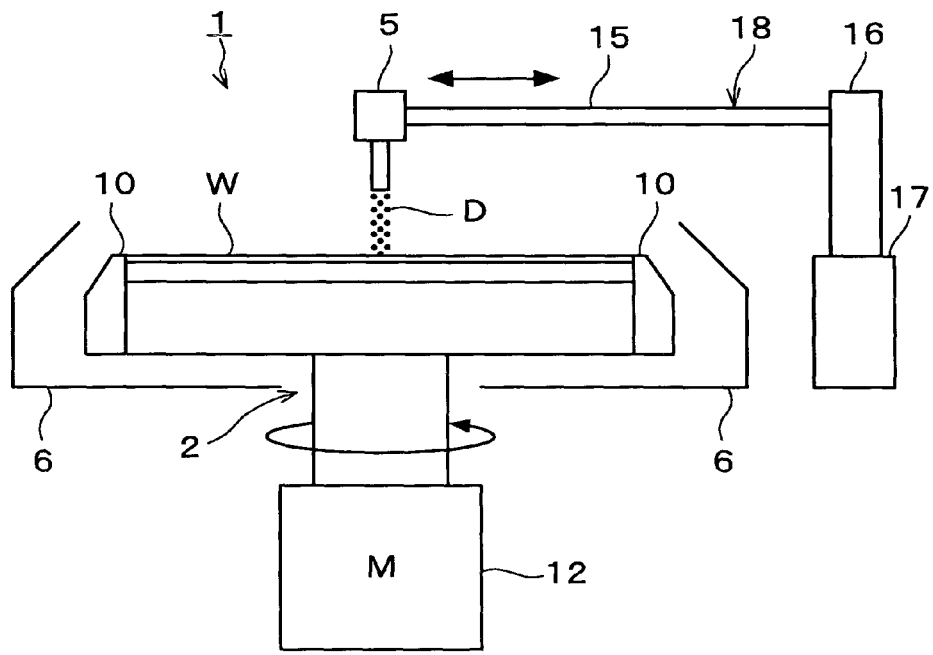
[FIG. 1] A schematic vertical cross-sectional view of a cleaning apparatus according to the present embodiment.

D liquid drop
W wafer
1 cleaning apparatus
2 spin chuck
5 two-fluid nozzle
18 drive mechanism
21 gas supply passage
22 liquid supply passage
23 lead-out passage
24 injection port
31 narrowed portion
32 liquid introduction passage
37 taper portion
38 narrowed portion

BEST MODE FOR CARRYING OUT THE INVENTION

Hereinafter, a preferred embodiment of the present invention will be described based on a substrate cleaning apparatus 1 configured to clean the surface of a wafer W as an example of a substrate. As shown in FIG. 1, the substrate cleaning apparatus 1 according to the embodiment of the present invention has a spin chuck 2 for holding a wafer W in a substantially disk shape substantially horizontally, a two-fluid nozzle 5 according to the embodiment of the present invention which mixes gas and liquid internally and injects liquid droplets (drops) with gas, and a cup 6 surrounding the periphery of the wafer W held by the spin chuck 2.

Figure 2:
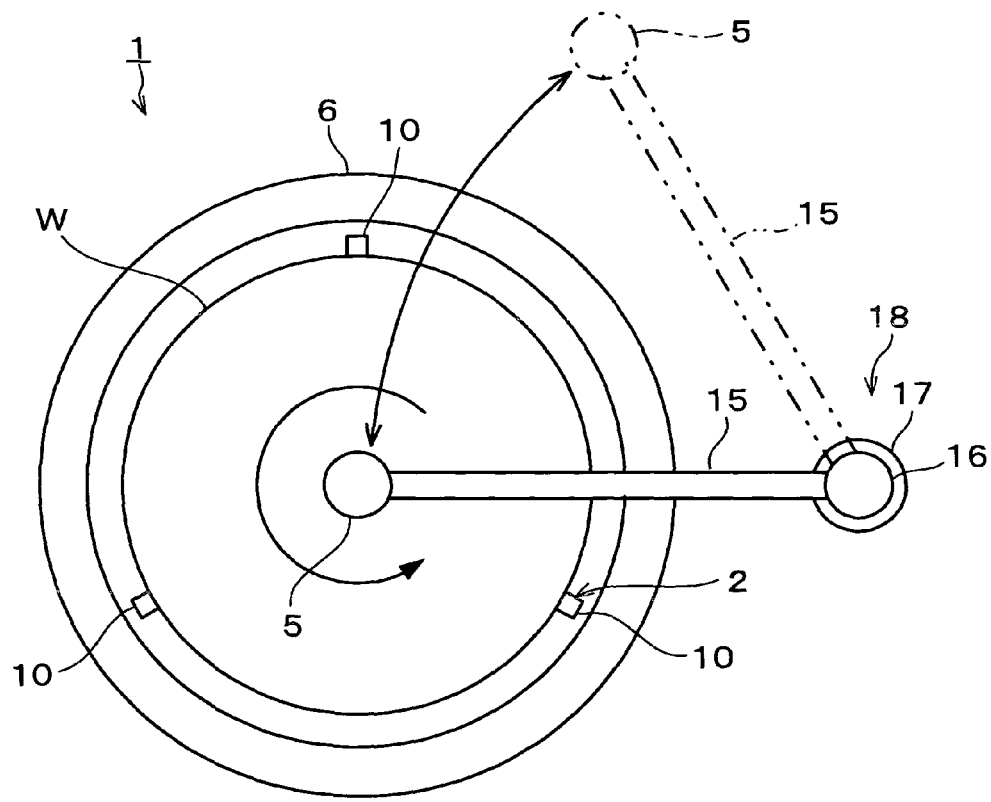
[FIG. 2] A schematic plan view of the cleaning apparatus according to the present embodiment.

As shown in FIG. 2, the spin chuck 2 has three holding members 10 on an upper side, and holds the wafer W by abutting these three holding members 10 onto three positions respectively of the periphery of the wafer W. As shown in FIG. 1, the spin chuck 2 is connected to a motor 12. By driving this motor 12, the spin chuck 2 is rotated so that the wafer W is rotated integrally with the spin chuck 2 within a substantially horizontal plane.

The two-fluid nozzle 5 is attached to the front end of a nozzle arm 15 arranged substantially horizontally above the wafer W held by the spin chuck 2. A base end of the nozzle arm 15 is fixed on a turning shaft 16 arranged outside the cup 6 in a substantially vertical direction, and a drive unit 17 is connected to the turning shaft 16. In this embodiment, a drive mechanism 18 which moves the two-fluid nozzle 5 is constituted of the nozzle arm 15, the turning shaft 16, and the drive unit 17. By driving this drive unit 17, the nozzle arm 15 can be turned within a substantially horizontal plane about the turning axis 16 so as to move the two-fluid nozzle 5 integrally with the nozzle arm 15 at least from above a center portion of the wafer W to above the periphery of the wafer W. Also, by driving the drive unit 17, the turning shaft 16 is raised/lowered so as to allow the two-fluid nozzle 5 to be raised/lowered integrally with the nozzle arm 15 and the turning shaft 16.

Figure 3:
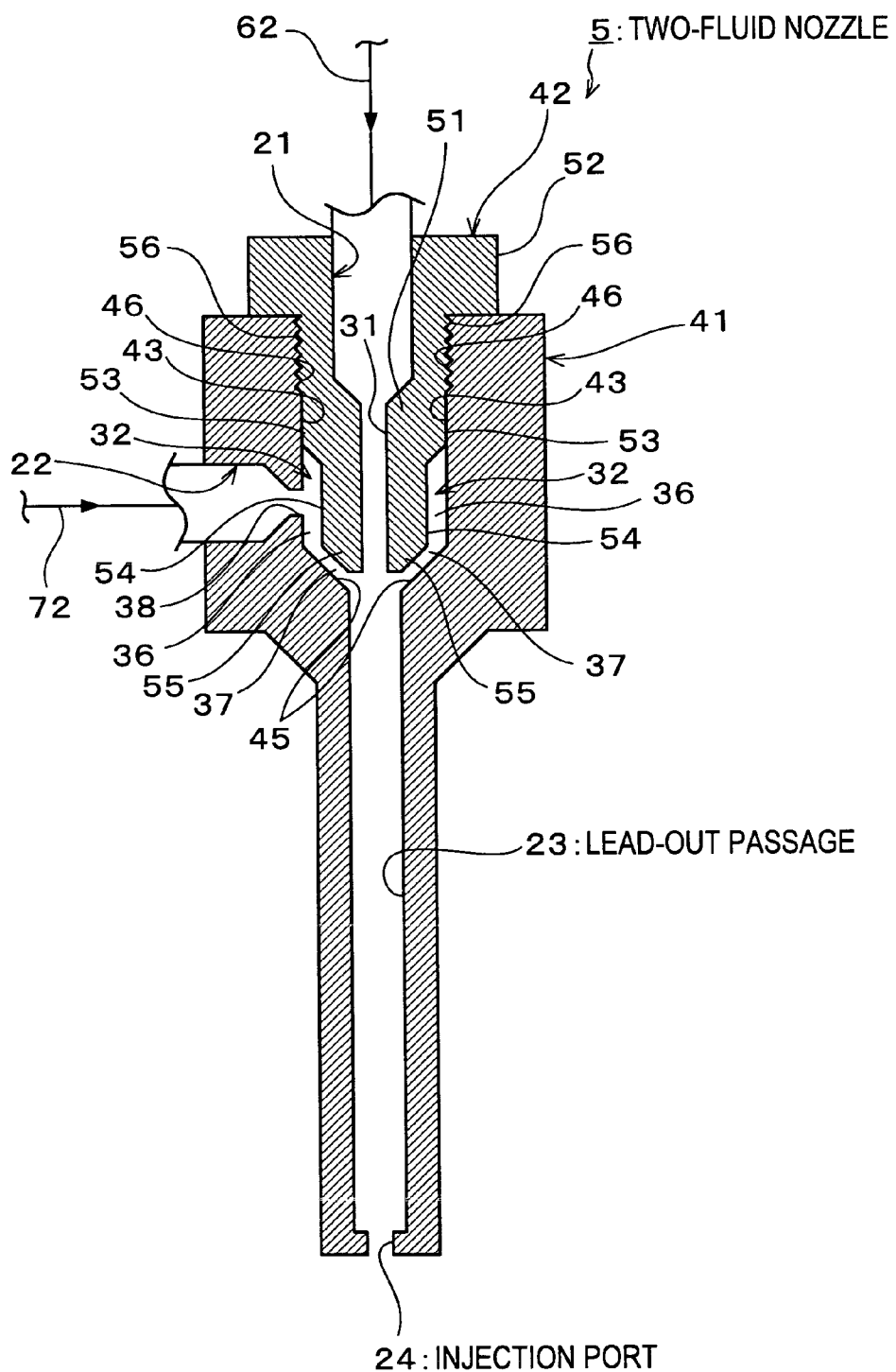
[FIG. 3] A schematic vertical cross-sectional view of a two-fluid nozzle according to the present embodiment.

As shown in FIG. 3, the two-fluid nozzle 5 is an internal mixing type two-fluid nozzle for cleaning substrates, which has a gas supply passage 21 for supplying gas such as nitrogen ($N_2$) for example to the inside of the two-fluid nozzle 5, a liquid supply passage 22 for supplying liquid such as pure water (DIW) for example to the inside of the two-fluid nozzle 5, and a lead-out passage 23 for leading out a jet flow of liquid droplets D formed inside the two-fluid nozzle 5 and nitrogen gas. On the front end of the lead-out passage 23, an injection port 24 is formed for injecting liquid droplets D to the outside.

The gas supply passage 21 is arranged coaxially with the lead-out passage 23. On an exit portion of the gas supply passage 21, a narrowed portion 31 is formed. The narrowed portion 31 is formed to have a cross-sectional area smaller than that of an upstream side portion thereof. The exit of the narrowed portion 31 is arranged adjacent to the entrance of the lead-out passage 23. Note that the cross-sectional area of the narrowed portion 31 is preferred to be constant from the entrance to the exit, and the cross-sectional shape of the narrowed portion 31 is preferred to be for example a circular shape, an oval shape or the like. As shown, when the cross-sectional area of the narrowed portion 31 is constant from the entrance to the exit, the cross-sectional area Sc of the exit of the gas supply passage 23 is equal to the cross-sectional area of the narrowed portion 31.

On the periphery of the gas supply passage 21, there is formed a liquid introduction passage 32 formed annularly surrounding the narrowed portion 31 of the gas supply passage 21. The liquid supply passage 22 is connected to the liquid introduction passage 32, and supplies pure water to the liquid introduction passage 32. The gas supply passage 21 is arranged to pass through inside the liquid introduction passage 32. This liquid introduction passage 32 is formed in a cylindrical shape having an annular cross-section. In the liquid introduction passage 32, an annular trench 36 and a taper portion 37 are formed, the taper portion 37 being formed with an inside diameter and an outside diameter which get smaller toward the front end side (lower side in FIG. 3). The taper portion 37 is formed rather closer to the front end side than the annular trench 36, and the exit of the taper portion 37 opens annularly between the exit of the narrowed portion 31 of the gas supply passage 21 and the entrance of the lead-out passage 23. Therefore, pure water introduced into the liquid introduction passage 32 mixes with nitrogen gas supplied from the narrowed portion 31 of the gas supply passage 21 in the vicinity of the entrance of the lead-out passage 23, thereby forming liquid droplets D. A base end side (upper side in FIG. 3) of the liquid introduction passage 32 is closed. Incidentally, the inclination of the taper portion 37 may form, for example, an angle of approximately 45° with respect to the gas supply passage 21 and the lead-out passage 23.

The liquid supply passage 22 is provided to form an appropriate angle with respect to the annular trench 36 of the liquid introduction passage 32, and opens on an outer peripheral face of the annular trench 36. In the shown example, the liquid supply passage 22 is provided to have a substantially perpendicular angle with respect to the outer peripheral face of the annular trench 36, which is substantially parallel to the gas supply passage 21. At an exit portion of the liquid supply passage 22, a narrowed portion 38 is formed. The narrowed portion 38 is formed in an orifice shape with a cross-sectional area smaller than that of an upstream side portion thereof. Then, the exit of the narrowed portion 38 is provided so as to open inward of the annular trench 36. The cross-sectional area of the narrowed portion 38 is preferred to be constant from the entrance to the exit, and the cross-sectional shape of the narrowed portion 38 is preferred to be for example a circular shape, an oval shape or the like. As shown, when the cross-sectional area of the narrowed portion 38 is constant from the entrance to the exit, the cross-sectional area Sd of the exit of the liquid supply passage 22 is equal to the cross-sectional area of the narrowed portion 38.

Figure 4:
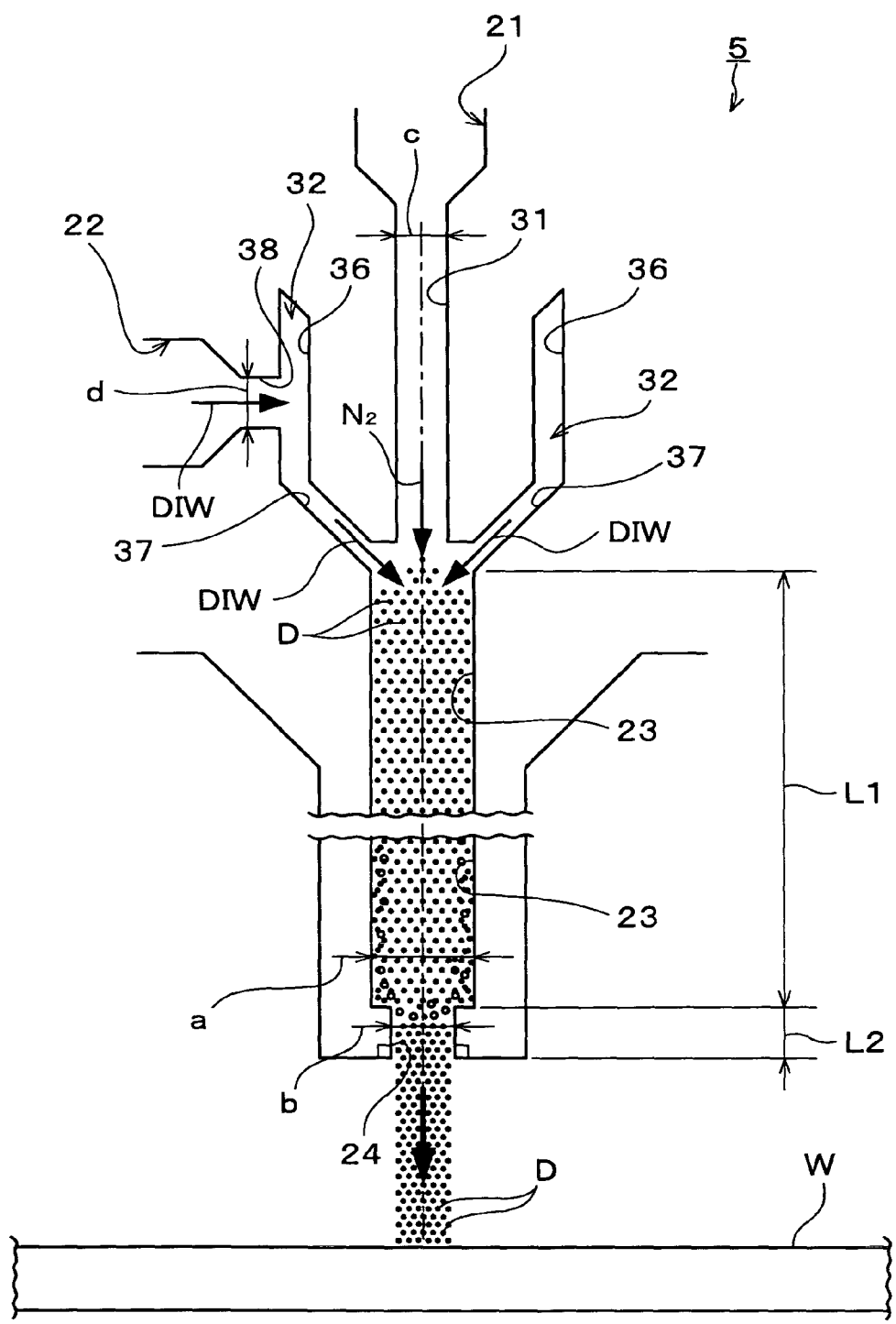
[FIG. 4] An explanatory view showing the structure of the inside of the two-fluid nozzle.

The lead-out passage 23 is arranged coaxially with the narrowed portion 31 of the gas supply passage 21 as described above, and is communicable to the gas supply passage 21 and the liquid introduction passage 32. The lead-out passage 23 is formed in a linear shape and the cross-sectional area Sa of the lead-out passage 23 is preferred to be constant from the entrance to the exit, and the cross-sectional shape of the lead-out passage 23 is preferred to be for example a circular shape, an oval shape or the like. As shown in FIG. 4, nitrogen gas $N_2$ supplied from the gas supply passage 21 and pure water DIW introduced from the liquid introduction passage 32 mix together in the vicinity of the entrance of the lead-out passage 23, whereby numerous liquid droplets D of pure water are formed and the formed liquid droplets D are lead out with nitrogen gas $N_2$ via the lead-out passage 23

The injection port 24 is formed in an orifice shape with a cross-sectional area smaller than that of the lead-out passage 23. When the injection port 24 in an orifice shape having such a cross-sectional shape smaller than that of the lead-out passage 23 does not exist liquid droplets D in a mist form grown along the inner wall of the lead-out passage 23 are ejected as they are. The cross-sectional area Sb of the injection port 24 is preferred to be constant from the entrance to the exit, and the cross-sectional shape of the injection port 24 is preferred to be for example a circular shape, an oval shape or the like. Liquid droplets D which passed through the lead-out passage 23 are atomized again while passing through the injection port 24 and injected. Therefore, in a case that liquid droplets D have grown largely while moving along the inner wall of the lead-out passage 23, the liquid droplets D can be atomized to have a sufficiently small particle diameter and injected by allowing them to pass through the injection port 24.

As shown in FIG. 4, the two-fluid nozzle 5 is preferred to be formed with the vertical cross-sectional shape of a portion along an exit side periphery of the injection port 24 having a right angle. Specifically, an inner face of the injection port 24 and a plane outside a front end portion of the two-fluid nozzle 5 are preferred to be formed perpendicular to each other. In this manner, liquid droplets D injected from the injection port 24 proceed straight easily in a direction to which the lead-out passage 23 and the injection port 24 are heading. On the other hand, if the vertical cross-sectional shape of the portion along the exit side periphery of the injection port 24 is not formed with a right angle, but a round or a taper face is formed thereon, liquid droplets D proceed along the round or the taper face and be injected obliquely with respect to the injection port 24, and liquid droplets D that proceed outward from the injection port 24 increase. By forming the exit periphery of the injection port 24 with a right angle, the straightness of liquid droplets D becomes good, and thus the liquid droplets D can be injected intensely and intensively toward a wafer W, which can improve contaminant removing performance. Note that also by forming the exit periphery of the injection port 24 with an acute angle, the straightness of the liquid droplets D becomes good similarly.

Further, as shown in FIG. 4, the two-fluid nozzle 5 is supported at the front end of the nozzle arm 15 with the gas supply passage 21, the lead-out passage 23, and the injection port 24 being directed in a vertical direction with respect to the top face of a wafer W held by the spin chuck 2. Specifically, a jet flow of liquid droplets D is injected substantially vertically with respect to the top face of the wafer W.

Further, if a length L1 of the lead-out passage 23 in the flowing direction of liquid droplets D is too long, liquid droplets D moving along the inner wall of the lead-out passage 23 converge together and become large easily. Conversely, if the length L1 of the lead-out passage 23 is too short, liquid droplets D cannot be accelerated enough inside the lead-out passage 23 and hence the injection speed of liquid droplets D from the injection port 24 becomes slow, and also re-atomization of liquid droplets D may not be performed sufficiently in the injection port 24. Therefore, it is needed that the length L1 of the lead-out passage 23 is formed with an appropriate length to thereby enable sufficient acceleration of liquid droplets D in a state of being sufficiently atomized. For example, the length L1 of the lead-out passage 23 is preferably approximately 10 mm to 90 mm.

Also, if the cross-sectional area Sa of the lead-out passage 23 is too large, the speed of liquid droplets D passing through the lead-out passage 23 becomes slow, which makes liquid droplets D moving along the inner wall of the lead-out passage 23 to converge together and become large easily. Conversely, if the cross-sectional area Sa of the lead-out passage 23 is too small, the flow rate of nitrogen gas $N_2$ inside the lead-out passage 23 is limited to be low, and thus liquid droplets D will not be formed favorably in the vicinity of the entrance of the lead-out passage 23, which may result in that the formed liquid droplets D are larger than a desirable particle diameter. Therefore, it is needed that the cross-sectional area Sa of the lead-out passage 23 is formed with an appropriate size for enabling supply of liquid droplets D to the injection port 24 in a state of being atomized sufficiently. For example, when the cross-sectional shape of the lead-out passage 23 is a circular shape, the diameter a of the lead-out passage 23 is preferably approximately 1 mm to 7 mm, more preferably approximately 3 mm to 5 mm. When the cross-sectional shape of the lead-out passage 23 is other than a circular shape, such as an oval shape, the cross-sectional area of the lead-out passage 23 is preferably approximately 0.785 mm$^2$ to 38.5 mm$^2$, more preferably approximately 7.07 mm$^2$ to 19.6 mm$^2$.

Moreover, if the cross-sectional area Sb of the injection port 24 is too small, the flow rate of N$_2$ gas inside the injection port 24 is limited to be low, and also the flow rate of N$_2$ gas in the gas supply passage 21 and the lead-out passage 23 is limited to be low, and thus liquid droplets D will not be formed favorably in the vicinity of the entrance of the lead-out passage 23, which may result in that the formed liquid droplets D are larger than a desirable particle diameter. Conversely if the cross-sectional area Sb of the injection port 24 is too large, the injection speed of liquid droplets D from the injection port 24 becomes slow, and also liquid droplets D may not be re-atomized sufficiently in the injection port 24. Therefore, it is needed that the cross-sectional area Sb of the injection port 24 is formed with an appropriate size to thereby enable injection of liquid droplets D with sufficient acceleration in a state of being atomized to be sufficiently small. For example, when the cross-sectional shape of the injection port 24 is a circular shape, the diameter b of the injection port 24 is preferably approximately 0.5 mm to 6 mm, more preferably, approximately 2 mm to 4 mm. When the cross-sectional shape of the injection port 24 is other than a circular shape, the cross-sectional area Sb of the injection port 24 is preferably approximately 0.996 mm to 28.3 mm, more preferably approximately 3.14 mm$^2$ to 12.6 mm$^2$. Further, when the cross-sectional shape of the lead-out passage 23 and the cross-sectional shape of the injection port 24 are both a circular shape, a ratio of the diameter a of the lead-out passage 23 and the diameter b of the injection port 24 is preferably approximately a: b=1:0.5 to 0.9. When b<0.5 a, a large-diameter mist of the inner wall of the lead-out passage 23 is atomized, but a difference between the speed at the lead-out passage 23 and the speed when passing through the injection port 24 is too large because the narrowness is too small. The mist speed does not catch up this speed difference (cannot accelerate), resulting in dispersion of the mist speed, which is not favorable. Also, control of the N$_2$ flow rate becomes more severe in use, which is not favorable. On the other hand, when b>0.9 a, uniformity of the mist speed is high, but re-atomization of the mist becomes difficult because the narrowness is large. Accordingly, a large amount of large diameter mists is ejected. Thus, the number of mists is decreased, resulting in decrease of cleaning performance, which is not favorable. On the other hand, when b=0.5 a to 0.9 a, the narrowness is appropriate, so that the balance between the re-atomization of mist and the uniformity of mist speed is good. When either of the cross-sectional shape of the lead-out passage 23 or the cross-sectional shape of the injection port 24 are other than a circular shape, such as an oval shape, the ratio of the cross-section of the lead-out passage 23 and the cross-section of the injection port 24 is preferably approximately 1:0.25 to 0.81.

A length L2 of the injection port 24 in the flowing direction of liquid droplets D is formed shorter as compared to the length L1 of the lead-out passage 23. If this length L2 of the injection port 24 is too long, liquid droplets D moving along the inner wall of the injection port 24 may converge together and become large. Therefore, the length L2 of the injection port 24 needs to be an appropriate length. The length L2 of the injection port 24 is preferably approximately 30 mm or shorter.

On the other hand, regarding the gas supply passage 21, if the cross-sectional area Sc of the exit of the gas supply passage 21, namely the cross-sectional area of the narrowed portion 31 is too small, the flow rate of nitrogen gas $N_2$ flowing out from the narrowed portion 31 is limited to be low, so that liquid droplets D cannot be accelerated enough in the lead-out passage 23, and thus the injection speed of liquid droplets D from the injection port 24 becomes slow. Conversely, if the cross-sectional area Sc of the exit of the gas supply passage 21 is too large, liquid droplets D will not be formed favorably in the vicinity of the entrance of the lead-out passage 23, which may result in that the formed liquid droplets D are larger than a desirable particle diameter. Therefore, it is needed that the cross-sectional area Sc of the exit of the gas supply passage 21 is formed with an appropriate size to thereby enable sufficient acceleration of liquid droplets D in a state of being atomized to be sufficiently small. Furthermore, the cross-sectional area Sc of the exit of the gas supply passage 21 is preferred to be formed smaller than the cross-sectional area Sa of the lead-out passage 23. When the cross-sectional area Sc of the exit of the gas supply passage 21 is formed smaller than the cross-sectional area Sa of the lead-out passage 23, the flow speed of the nitrogen gas $N_2$ gets faster when passing through the exit (narrowed portion 31) of the gas supply passage 21, and the effect of turning pure water DIW introduced from the liquid introduction passage 32 into mist increases. Further, there is an effect to uniform the mist speed. For example, when the cross-sectional shape of the exit of the gas supply passage 21 is a circular shape, the diameter c of the exit (narrowed portion 31) of the gas supply passage 21 is preferably approximately 1.2 mm to 2.8 mm, more preferably approximately 1.5 mm to 2.5 mm. FIG. 5 is a graph showing a relationship between the diameter c and cleaning performance (particle removing rate) when the cross-sectional shape of the exit of the gas supply passage 21 is a circular shape, which is examined in later-described examples. It can be seen that the cleaning performance is high when the diameter c is in the range of approximately 1.2 mm to 2.8 mm, preferably approximately 1.5 mm to 2.5 mm. When the cross-sectional shape of the exit of the gas supply path 21 is other than a circular shape, such as an oval shape, the cross-sectional area Sc of the exit (narrowed portion 31) of the gas supply passage 21 is preferably approximately 1.13 $mm^2$ to 6.16 $mm^2$, more preferably approximately 1.77 $mm^2$ to 4.19 $mm^2$. Further, the cross-sectional area Sc of the exit (narrowed portion 31) of the gas supply passage 21 is preferred to be formed equal to the cross-sectional area Sb of the injection port 24 or smaller than the cross-sectional area Sb of the injection port 24. In order to atomize liquid droplets D to uniform the mist speed, it is effective to make the cross-sectional area Sc of the exit (narrowed portion 31) of the gas supply passage 21 equal to or smaller than the cross-sectional area Sb of the injection port 24 to thereby increase the $N_2$ flow speed at the mixing portion of the nitrogen gas $N_2$ and the pure water DIW. The mist speed needs to be dropped for cleaning of particularly a miniaturized pattern or the like, and it is more effective in such a case. When the cross-sectional shape of the exit of the gas supply passage 21 and the cross-sectional shape of the injection port 24 are both a circular shape, a ratio between the diameter c of the exit (narrowed portion 31) of the gas supply passage 21 and the diameter b of the injection port 24 is preferably approximately b: c=1:0.4 to 0.93. For example, if the diameter b of the injection port 24 is 3 mm, pressure loss at the narrowed portion 31 increases when $c<0.4$ b and the $N_2$ supply pressure is in a normal use range, by which the $N_2$ flow rate cannot be increased and the mist speed at an eject portion slows down, by which sufficient cleaning force cannot be obtained, which is not favorable. On the other hand, when the diameter c of the exit (narrowed portion 31) of the gas supply passage 21>0.93 b, the $N_2$ flow speed at a mixing portion is slow, so that the atomization of liquid droplets is not sufficient, which is not favorable. On the other hand, when c=0.4 b to 0.93 b, the $N_2$ flow speed becomes appropriate, which is favorable for generating a fine mist and uniformizing the mist speed. When either of the cross-sectional shape of the exit of the gas supply passage 21 or the cross-sectional shape of the injection port 24 is other than a circular shape, such as an oval shape, the ratio of the cross-sectional area Sb of the injection port 24 and the cross-sectional area Sc of the exit (narrowed portion 31) of the gas supply passage 21 is preferably approximately Sb:Sc=1:0.16 to 0.87.

Further, if the flow rate of nitrogen gas $N_2$ supplied from the exit (narrowed portion 31) of the gas supply passage 21 is low, it is difficult to atomize liquid droplets D sufficiently, and the mean particle diameter of liquid droplets D becomes large. If the flow rate of nitrogen gas $N_2$ supplied from the exit (narrowed portion 31) of the gas supply passage 21 is high, exhausting inside the cup 6 shown in FIG. 1 is not performed sufficiently, which causes a problem that particles adhere on the wafer W again. The flow rate of nitrogen gas $N_2$ flowing out from the exit (narrowed portion 31) of the gas supply passage 21 is preferably approximately 5 L to 200 L/min (normal) for example, more preferably approximately 10 L to 100 L/min (normal). Furthermore, if the flow rate of nitrogen gas $N_2$ supplied from the exit (narrowed portion 31) of the gas supply passage 21 is low with respect to the flow rate of the pure water DIW supplied from the exit (narrowed portion 38) of the liquid supply passage 22, it is difficult to atomize liquid droplets D sufficiently and the mean particle diameter of liquid droplets D becomes large. The flow rate of nitrogen gas $N_2$ supplied from the exit (narrowed portion 31) of the gas supply passage 21 is preferably approximately 50 times or more, more preferably approximately 100 times or more of the flow rate of pure water DIW supplied from the exit (narrowed portion 31) of the liquid supply passage 22.

In the liquid supply passage 22, if the cross-sectional area Sd of the exit of the liquid supply passage 22, namely the cross-sectional area of the narrowed portion 38, is too small, the flow rate of pure water DIW flowing out from the narrowed portion 38 is limited to be low, and the number of liquid droplets D to be formed decreases. Conversely, if the cross-sectional area Sd of the exit of the liquid supply passage 22 is too large, liquid droplets D to be formed may become larger than a desirable particle diameter. Therefore, it is needed to form the cross-sectional area Sd of the exit (narrowed portion 38) of the liquid supply passage 22 with an appropriate size so as to enable formation of a desirable number of liquid droplets D with a desirable particle diameter. For example, when the cross-sectional shape of the exit (narrowed portion 38) of the liquid supply passage 22 is a circular shape, the diameter d of the exit (narrowed portion 38) of the liquid supply passage 22 is preferably approximately 0.5 mm to 5 mm, more preferably approximately 1 mm to 3 mm. When the cross-sectional shape of the exit (narrowed portion 38) of the liquid supply passage 22 is other than a circular shape, such as an oval shape, the cross-sectional area Sd of the exit (narrowed portion 38) of the liquid supply passage 22 is preferably approximately 0.196 $mm^2$ to 19.625 $mm^2$, more preferably approximately 0.785 $mm^2$ to 7.065 $mm^2$. Further, when the cross-sectional shape of the exit (narrowed portion 38) of the liquid supply passage 22 and the cross-sectional shape of the injection port 24 are both a circular shape, the ratio between the diameter d of the exit (narrowed portion 38) of the liquid supply passage 22 and the diameter b of the injection port 24 is preferably approximately d:b=1:1 to 3. When either of the cross-sectional shape of the exit (narrowed portion 38) of the liquid supply passage 22 or the cross-sectional shape of the injection port 24 is other than a circular shape, such as an oval shape, the ratio between the cross-sectional area Sd of the exit (narrowed portion 38) of the liquid supply passage 22 and the cross-sectional area Sb of the injection port 24 is preferably approximately Sd:Sb=1:1 to 9.

Further, if the flow rate of pure water DIW supplied from the narrowed portion 38 (liquid supply passage 22) is low, the cleaning performance becomes low because the number of liquid droplets D decreases. If the flow rate of pure water DIW supplied from the narrowed portion 38 is high, it is difficult to atomize the liquid droplets D sufficiently, and the mean particle diameter of liquid droplets D becomes large. The flow rate of pure water DIW supplied from the narrowed portion 38 is, for example, preferably approximately 20 mL to 500 mL/min, more preferably approximately 100 mL to 200 mL/min.

As shown in FIG. 3, the two-fluid nozzle 5 is constituted of a nozzle main body 41 in which the liquid supply passage 22, the liquid introduction passage 32, the lead-out passage 23, and the injection port 24 are formed, and an engagement member 42, in which the gas supply passage 21 is formed and which is engaged with the nozzle main body 41. On a base end side of the nozzle main body 41, a hollow portion 43 opening at an outside face of the base end portion of the nozzle main body 41 is formed in a cross-sectionally circular shape. On the front end side of the nozzle main body 41, the lead-out passage 23 is formed. The hollow portion 43 is formed coaxially with the lead-out passage 23. Between the front end of the hollow portion 43 and the entrance of the lead-out passage 23, there is a taper face 45 formed to get narrow from the hollow portion 43 side toward the lead-out passage 23 side. Further, on the opening side of the hollow portion 43, a thread groove 46 is formed. The liquid supply passage 22 opens on the inner face of the hollow portion 43 between the taper face 45 and the thread groove 46.

The engagement member 42 is constituted of an insertion body 51 to be inserted into the hollow portion 43 and a head 52 arranged on the base end side of the nozzle main body 41. The insertion body 51 has, for example, a large cylinder portion 53 in a cylindrical shape formed with an inside diameter substantially equal to that of the hollow portion 43, a small cylinder portion 54 in a cylindrical shape provided on the front end side of the large cylinder portion 53 and formed with an outside diameter smaller than the inside diameter of the hollow portion 43, and a truncated cone portion 55 in a truncated cone shape formed rather closer to the front end side than the small cylinder portion 54 and to get narrow toward the front end side. Further, on an outside face of the large cylinder portion 53, a thread groove 56 for being screwed with the thread groove 46 of the hollow portion 43 is provided. The head 52 is formed with a diameter larger than the inside diameter of the hollow portion 43 and the outside diameter of the large cylinder portion 53. The gas supply passage 21 is provided to penetrate, from a base end side face of the head 52, respective center portions of the large cylinder portion 53, the small cylinder portion 54, and the truncated cone portion 55, and the exit of the narrowed portion 31 is formed to open on a plane of the front end portion of the truncated cone portion 55.

In a state that the insertion body 51 of the engagement member 42 is inserted into the hollow portion 43 to screw the thread groove 46 with the thread groove 56, an annular gap, namely the liquid introduction passage 32 is formed between the outside face of the small cylinder portion 54 and the inside face of the hollow portion 43. Further, between the outside face of the truncated cone portion 55 and the taper face 45, an annular gap, namely the taper portion 37 is formed. The head 52 is provided to block the hollow portion 43 so as to closely contact the peripheral face of the opening of the hollow portion 43.

Note that as a material for the nozzle body 41 and the engagement member 42 constituting the two-fluid nozzle 5, it is preferable to use, for example, a fluorine resin or the like such as PTFE (polytetrafluoroethylene).

Figure 6:
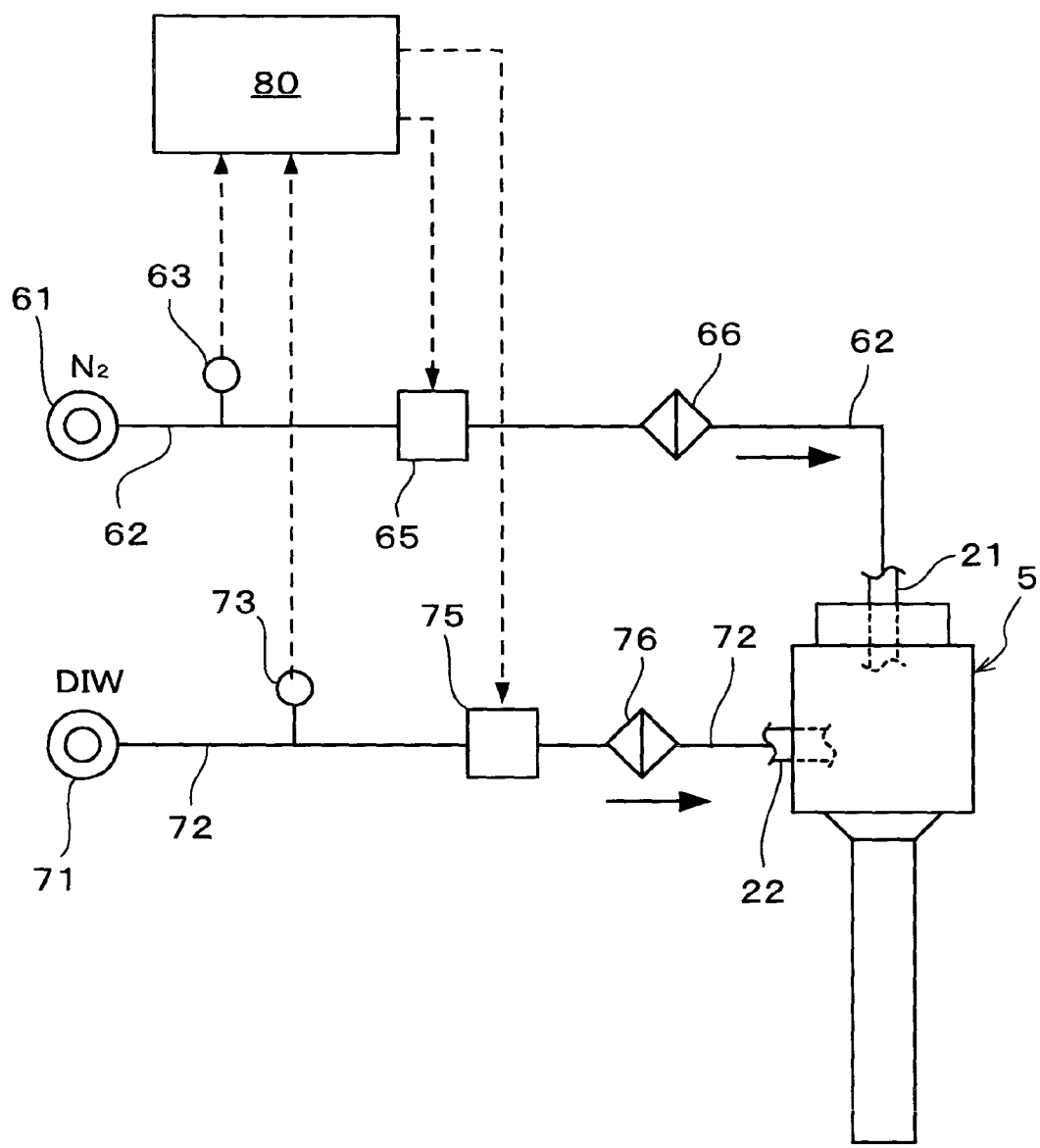
[FIG. 6] An explanatory view of a gas supply pipe and a liquid supply pipe.

As shown in FIG. 6, to the gas supply passage 21, a gas supply pipe 62 supplying nitrogen gas from the nitrogen gas supply source 61 is connected. On the gas supply pipe 62, a flow meter 63, a flow rate adjusting valve 65, and a filter 66 are interposed in this order from the nitrogen supply source 61 side. Further, on the liquid supply passage 22, a liquid supply pipe 72 for supplying pure water from a pure water supply source 71 is connected. On the liquid supply pipe 72, a flow meter 73, a flow rate adjusting valve 75, and a filter 76 are interposed in this order from the pure water supply source 71 side.

Further, there is provided a control unit 80 for outputting an instruction to manipulate the flow rate adjusting value 65 and the flow rate adjusting valve 75. Flow rates detected by the flow meters 63, 73 are monitored by the control unit 80. The control unit 80 outputs an instruction to adjust the opening degree of the flow rate adjusting valve 65 so that the nitrogen gas flows at a desired flow rate inside the gas supply pipe 62 based on a flow rate detection value from the flow meter 63. Further, the control unit 80 outputs an instruction to adjust the opening degree of the flow rate adjusting valve 75 so that the pure water flows at a desired flow rate inside the liquid supply pipe 72 based on a flow rate detection value from the flow meter 73.

Now, regarding this cleaning apparatus 1, first by a not-shown carry arm, a wafer W yet to be cleaned is carried into the cleaning apparatus 1, and the wafer W is passed to the spin chuck 2 as shown in FIG. 1. At this time, the wafer W is held by the spin chuck 2 with its surface (a face on which a pattern is formed) being the top face. When the wafer W is passed to the spin chuck 2, as shown by chain double-dashed lines in FIG. 2, the two-fluid nozzle 5 and the nozzle arm 15 are retreated to the outside of the cup 6. After the wafer W is passed to the spin chuck 2, the drive unit 17 is driven to turn the nozzle arm 15, and as shown by solid lines in FIG. 2, the two-fluid nozzle 5 is moved to above the wafer W, and injection of liquid droplets D is started. On the other hand, the spin chuck 2 is rotated by driving the motor 12 shown in FIG. 1 to start rotating the wafer W. Then, while the two-fluid nozzle 5 is moved from above a center portion of the wafer W toward above a peripheral portion of the wafer W, a jet flow is injected to the surface of the rotating wafer W. Accordingly, the jet flow is injected on the entire surface of the wafer W, thereby removing contaminants adhering on the surface of the wafer W.

The jet flow is formed as described below. First, the flow rate adjusting valve 65 is opened to allow nitrogen gas $N_2$ supplied form the nitrogen gas supply source 61 to pass through the gas supply pipe 62 and the gas supply passage 21. The flow rate of the nitrogen gas $N_2$ inside the gas supply pipe 62 is controlled to be a desired value by adjusting the flow rate adjusting valve 65 based on a detected value from the flow meter 63 by an instruction from the control unit 80. Therefore, the nitrogen gas $N_2$ can be supplied at an appropriate flow rate to the gas supply passage 21. The nitrogen gas $N_2$ that has passed through the gas supply passage 21 is discharged from the narrowed portion 31 as shown in FIG. 4 and flows into the entrance of the lead-out passage 23.

While supplying the nitrogen gas $N_2$ in this manner, the flow rate regulating valve 75 is opened to allow pure water DIW supplied from the pure water supply source 71 to pass through the liquid supply pipe 72 and the liquid supply passage 22. The flow rate of the pure water DIW inside the liquid supply pipe 72 is controlled to be a desired value by adjusting the flow rate adjusting valve 75 based on a detected value from the flow meter 73 by an instruction from the control unit 80. Therefore the pure water DIW can be supplied to the liquid supply passage 22 at an appropriate flow rate. The pure water DIW that has passed through the liquid supply passage 22 is, as shown in FIG. 4, discharged in a substantially vertical direction from the narrowed portion 38 to the annular trench 36 of the liquid introduction passage 32 and flows into the annular trench 36, and spreads annularly from the exit of the narrowed portion 38 along the inner face of the annular trench 36, and moreover, the pure water DIW flows annularly into the entire taper portion 37. Then, from the taper portion 37 to the entrance of the lead-out passage 23, the pure water DIW is discharged obliquely.

The nitrogen gas $N_2$ that has passed through the gas supply passage 21 and the pure water DIW that has passed through the taper potion 37 are discharged respectively to the entrance of the lead-out passage 23 and mix with each other. The nitrogen gas $N_2$ is discharged straight from the narrowed portion 31 of the gas supply passage 21 to the lead-out passage 23, and the pure water is discharged obliquely from the entire periphery of the entrance of the lead-out passage 23 toward the entrance of the lead-out passage 23. As a result of mixing of the nitrogen gas $N_2$ and the pure water DIW, the pure water DIW collided with the nitrogen gas $N_2$ become fine particles to form liquid droplets D of the pure water DIW. The nitrogen gas $N_2$ and the pure water DIW are supplied from the narrowed portion 31 and the taper portion 37 respectively at an appropriate flow rate so that a sufficient number of liquid droplets D with a sufficiently small particle diameter are formed.

The jet flow of liquid droplets D and nitrogen gas $N_2$ is lead out via the lead-out passage 23 and heads toward the injection port 24. The liquid droplets D are accelerated by the flow of nitrogen gas $N_2$ when passing through the lead-out passage 23. The length L1 of the lead-out passage 23 is set to an enough length for allowing sufficient acceleration of the liquid droplets D, and the nitrogen gas $N_2$ is supplied to the lead-out passage 23 at an appropriate flow rate for accelerating the liquid droplets D sufficiently, so that the liquid droplets D can be accelerated to a sufficient speed and injected from the injection port 24, and collided with the surface of the wafer W. Therefore, contaminants can be favorably removed from the surface of the wafer W. Further, the length L1 of the lead-out passage 23 is set to an appropriate length for suppressing the liquid droplets D to converge together and become large when passing through the lead-out passage 23, and thus the liquid droplets D are lead out to the injection port 24 as fine particles as they are.

The jet flow passing through the lead-out passage 23 may include liquid droplets D which are not formed with a sufficiently small particle diameter when the pure water DIW and the nitrogen gas $N_2$ are mixed, or liquid droplets D which grew large along the inner wall of the lead-out passage 23 while passing through the lead-out passage 23. Even when these large liquid droplets D are mixed, they are re-atomized while passing through the injection port 24 and divided into sufficiently small liquid droplets D, and thus it is possible to prevent collision of large liquid droplets D with the surface of the wafer W. Therefore, damage on the surface of the wafer W can be prevented. Further, the number of liquid droplets D increases. Also, since the large liquid droplets D divide into plural liquid droplets D in the injection port 24, the number of liquid droplets D increases. Therefore, a large number of fine-particle liquid droplets D can be collided with the surface of the wafer W, and thus contaminants can be removed favorably from the surface of the wafer W. Furthermore, as compared to a case of not providing the injection port 24, there is an effect that the particle diameter and the injection speed of the liquid droplets D are uniformed. Specifically, liquid droplets D at a slow injection speed which do not participate in removal of contaminants, liquid droplets D at a too high injection speed which may damage the surface of a wafer W or large liquid droplets D can be decreased, and thereby a large number of liquid droplets D can be injected at a favorable injection speed for removal of contaminants. Therefore, while improving the contaminant removing performance, damage on the surface of a wafer W due to large liquid droplets D or fast liquid droplets D can be prevented. Note that for removing contaminants without damaging the surface of a wafer W, the particle diameter of a liquid drop D is preferably approximately 100 μm or smaller, and the speed thereof is preferably approximately 80 m/sec or lower. More preferably, the mean value of particle diameters of liquid droplets D is approximately 50 μm or smaller and the maximum particle diameter is approximately 100 μm or smaller, and the mean value of the speed of liquid droplets D is approximately 40 m/sec or larger and approximately 80 m/sec or smaller.

Since the vertical cross-sectional shape of the exit side periphery of the injection port 24 has a right angle, the straightness of liquid droplets D is good and liquid droplets D collide intensely with the surface of the wafer W, and thus contaminants can be favorably removed from the surface of the wafer W.

After generating a jet flow of liquid droplets D by the two-fluid nozzle 5 as described above and the entire surface of the wafer W is cleaned by the jet flow, the flow rate adjusting valve 65 and the flow rate adjusting valve 75 are closed by an instruction from the control unit 80, and the injection of the jet flow from the two-fluid nozzle 5 is stopped. Then, as shown by the chain double-dashed lines in FIG. 2, the two-fluid nozzle 5 and the nozzle arm 15 are retracted to the outside of the cup 6. Further, driving of the motor 12 is stopped to stop rotation of the spin chuck 2 and the wafer W. Then, the carry arm (not-shown) is moved into the cleaning apparatus 1, and the wafer W is received from the spin chuck 2 and carried out from the cleaning apparatus 1 by the carry arm (not-shown). Thus, the processing in the cleaning apparatus 1 is completed.

According to this two-fluid nozzle 5, by providing the injection port 24 in an orifice shape on the front end of the lead-out passage 23 and allowing liquid droplets D to pass through the injection port 24, the liquid droplets D can be re-atomized to be a particle shape with a sufficiently small particle diameter and injected. Even when a large liquid drop D is formed, it is re-atomized in the injection port 24, so that the liquid droplets D can be injected with their particle diameters being uniformed with a small particle diameter. Therefore, collision of large liquid droplets D with the surface of a wafer W can be prevented, and damage on the surface of the wafer W can be prevented. Furthermore, since a large number of fine-particle liquid droplets D are formed by re-atomizing and a large number of liquid droplets D can be collided with the surface of the wafer W, the contaminant removing performance improves. Further, by setting the lead-out passage 23 and the injection port 24 to sufficient lengths, liquid droplets D which are sufficiently atomized can be injected at an appropriate speed. Therefore, good contaminant removing performance can be obtained. Furthermore, speeds of liquid droplets D can be uniformed. Specifically, since a large number of liquid droplets D can be injected at an appropriate injection speed, damage on the surface of the wafer W can be prevented while improving the contaminant removing performance. Further, by the cleaning apparatus 1 according to the present invention, the contaminant removing characteristic can be improved without damaging the surface of a wafer W.

In the foregoing, the example of the preferred embodiment of the present invention has been described, but the present invention is not limited to the embodiment described herein. For example, in this embodiment, the liquid is pure water and the gas is nitrogen gas, but they are not limited thereto, where the liquid may be a chemical solution or the like for cleaning, and the gas may be air or the like. Also, the substrate is not limited to a semiconductor wafer, which may be another glass for LCD substrates, or a CD substrate, a print substrate, a ceramic substrate, or the like.

Arrangements and shapes of the gas supply passage 21, the liquid supply passage 22, and the liquid introduction passage 32 are not limited to those shown in the embodiment. Further, in this embodiment, as an example of the structure of the two-fluid nozzle 5, one is described which is constituted of the nozzle main body 41 and the engagement member 42, in which the liquid introduction passage 32 is formed between the small cylinder portion 54 of the nozzle main body 41 and the hollow portion 43 of the nozzle main body 41, but the structure of the two-fluid nozzle 5 is not limited thereto.

Figure 7:
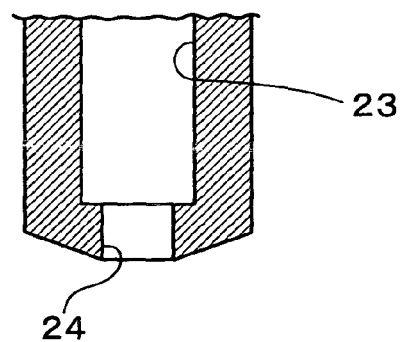
[FIG. 7] A vertical cross-sectional view showing an enlarged shape of a front end portion of a two-fluid nozzle according to another embodiment.

In this embodiment, the vertical cross-sectional shape of the portion along the exit side periphery of the injection port 24 is formed with a right angle, but the vertical cross-sectional shape of the portion along the exit side periphery of the injection port 24 may have an acute angle as shown in FIG. 7. For example, the periphery of the injection port 24 with a substantially circular cross-section is formed to have an outside diameter which gets smaller toward its front end, and a substantially truncated cone face is formed along the periphery of the exit of the injection port 24. Also in this case, liquid droplets D injected from the injection port 24 proceed straight easily in a direction to which the lead-out passage 23 and the injection port 24 are heading, and the liquid droplets D can be injected intensely and intensively toward a wafer W, which can improve the contaminant removing performance.

Figure 8:
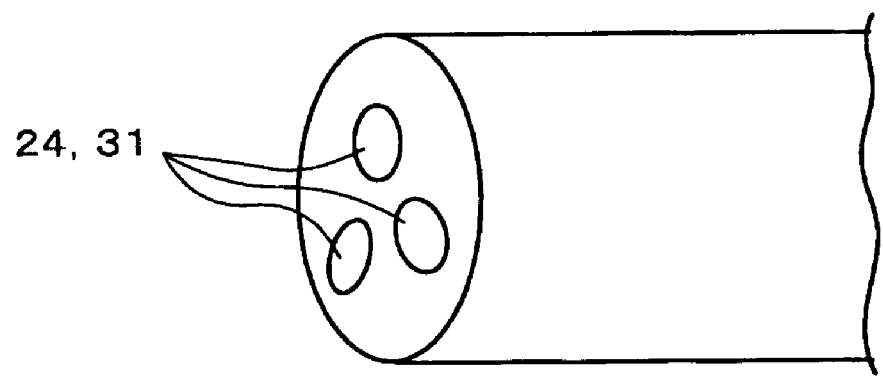
[FIG. 8] An explanatory view of an embodiment in which an injection port or a narrowed portion is formed as plural holes (multiple holes).

Further, the cross-sectional shape of the injection port 24 and the cross-sectional shape of the narrowed portion 31 are both described as a circular shape, but these shapes are not limited to a circular shape, where any shape may be adopted. For example, as shown in FIG. 8, the injection port 24 and the narrowed portion 31 may be formed as plural holes (multiple holes).

Example 1

The diameter a of the lead-out passage 23, the diameter b of the injection port 24, the diameter c of the narrowed portion 31, and the diameter d of the narrowed portion 38 were set as a: b=1:0.75, b: c=1:0.67, a: c=1:0.5, and d: b=1:3 as shown in Table 1. Note that the cross-sectional shape of the lead-out passage 23, the cross-sectional shape of the injection port 24, the cross-sectional shape of the narrowed portion 31, and the cross-sectional shape of the narrowed portion 38 are all a circular shape. This two-fluid nozzle 5 was used to perform cleaning tests of a wafer W, and contaminant removing performance of the two-fluid nozzle 5 was confirmed. As a result, good contaminant removing performance was obtained without damaging the surface of the wafer W.

TABLE 1

| RATIO TERM | RATIO (EXAMPLE 1) | OPTIMUM RATIO |
| --- | --- | --- |
| a:b | 1:0.75 | 1:0.5~0.9 |
| b:c | 1:0.67 | 1:0.4~0.93 |
| a:c | 1:0.5 | 1:0.5~1.0 |
| d:b | 1:3 | 1:1.0~3.0 |

Example 2

Figure 5:
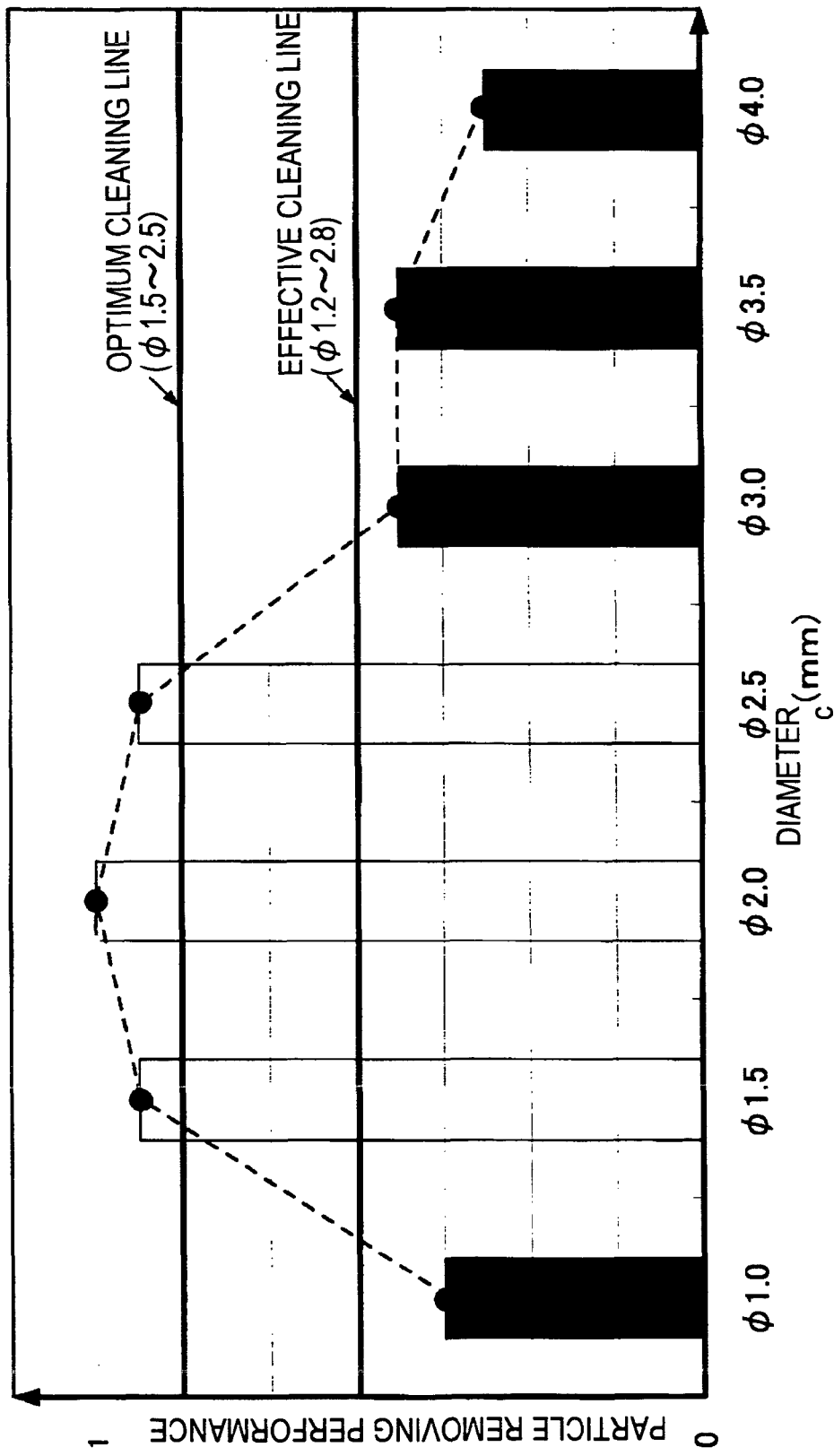
[FIG. 5] A graph showing a relationship between a diameter c of the exit of a gas supply passage and cleaning performance (particle removing rate).
Figure 9:
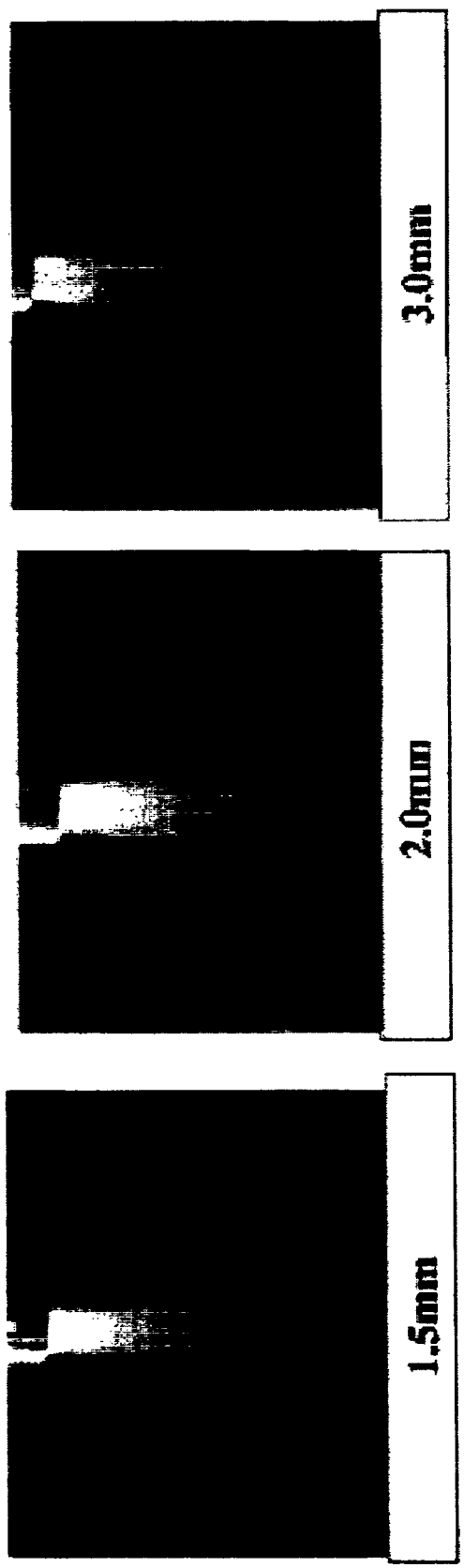
[FIG. 9] A photograph showing a generation state of a mist when the diameter c of the exit of the gas supply path is 1.5 mm, 2.0 mm, and 3.0 mm.

In the two-fluid nozzle 5 used in the example 1, the diameter c of the exit (narrowed portion 31) of the gas supply passage 21 was changed to check the relationship between the diameter c and the cleaning performance (particle removing rate). As a result, FIG. 5 and FIG. 9 were obtained. Note that in FIG. 5, with the particle removing rate of when the diameter c=2.0 mm with which the cleaning performance was the highest being 1, the particle removing rate of each diameter c is shown by the ratio with respect to the particle removing rate 1. As shown in FIG. 5, when the diameter c of the exit (narrowed portion 31) of the gas supply passage 21 is in the range of 1.2 mm to 2.8 mm, an effective particle removing rate can be obtained. Especially, with the diameter c in the range of 1.5 mm to 2.5 mm, a particle removing rate which is considered to be the optimum can be assured. Further, it was found that as the diameter c of the exit (narrowed portion 31) of the gas supply passage 21 gets smaller, a mist diameter gets smaller and speed distribution becomes uniform. Especially, in order to atomize a mist at a low flow rate, it is more advantageous as the diameter c gets smaller. As shown in FIG. 9, as compared to the diameter c being 1.5 mm and 2.0 mm, the diameter c being 3.0 mm caused difficulty in generation of a fine mist.

Industrial Applicability

The present invention can be used favorably for removing contaminants adhering on the surface of a semiconductor substrate or the like for example.

What is claimed is:

1. A two-fluid nozzle for cleaning substrates which mixes gas and liquid internally and injects liquid droplets with gas so as to clean a substrate, comprising:
a gas supply passage for supplying gas, a liquid supply passage for supplying liquid, and a lead-out passage for leading out internally-formed liquid droplets which are formed by internally mixing gas and liquid,
wherein said gas supply passage and said liquid supply passage open toward an entrance of said lead-out passage which is formed at a rear end of said lead-out passage, and mix the gas and the liquid in the vicinity of said lead-out passage entrance,
wherein an injection port for injecting liquid droplets to the outside is formed at the front end of said lead-out passage,
wherein a transition between the lead-out passage and the injection port is step-wise such that a cross-sectional area Sb of said injection port is smaller than a cross-sectional area Sa of said lead-out passage,
wherein a cross-sectional area Sc of an exit of said gas supply passage is smaller than the cross-sectional area Sa of said lead-out passage,
wherein said lead-out passage is formed in a straight shape,
wherein the cross-sectional area Sb of said injection port is constant from an entrance thereof at the step-wise transition to an exit thereof and
wherein the cross-sectional area Sc of the exit of said gas supply passage is equal to the cross-sectional area Sb of said injection port or smaller than the cross-sectional area Sb of said injection port.

2. The two-fluid nozzle for cleaning substrates as set forth in claim 1,
wherein a ratio Sa: Sb between the cross-sectional area Sa of said lead-out passage and the cross-sectional area Sb of said injection port is 1:0.25 to 0.81.

3. A two-fluid nozzle for cleaning substrates which mixes gas and liquid internally and injects liquid drops with gas so as to clean a substrate, comprising:
a gas supply passage for supplying gas, a liquid supply passage for supplying liquid, and a lead-out passage for leading out liquid drops formed by atomizing liquid with gas, and an injection means, wherein
said gas supply passage and said liquid supply passage open toward an entrance of said lead-out passage which is formed at a rear end of said lead-out passage, and mix the gas and the liquid in the vicinity of said lead-out passage entrance,
said injection means re-atomizes liquid drops passed through said lead-out passage and injects liquid drops to the outside, and
said injection means is connected to a front end of said lead-out passage by a step-wise transition between said lead-out passage and said injection means.

4. The two-fluid nozzle for cleaning substrates as set forth in claim 3,
wherein the cross-sectional area Sc of the exit of said gas supply passage is 1.77 mm$^2$ to 4.91 mm$^2$.

5. The two-fluid nozzle for cleaning substrates as set forth in claim 1,
wherein said lead-out passage is formed in a straight shape, and the cross-sectional area Sa of said lead-out passage is constant.

6. The two-fluid nozzle for cleaning substrates as set forth in claim 1,
wherein a length L1 of said lead-out passage is 10 mm to 90 mm.

7. The two-fluid nozzle for cleaning substrates as set forth in claim 1, wherein a length L2 of said injection port is 30 mm or shorter.

8. The two-fluid nozzle for cleaning substrates as set forth in claim 1, comprising a liquid introduction passage in an annular shape surrounding said gas supply passage, and having a structure such that
said gas supply passage is arranged coaxially with said lead-out passage,
said liquid supply passage is opened on an outer peripheral face of said liquid introduction passage,
a taper portion is formed with a diameter which gets smaller toward a front end side in said liquid introduction passage,
the taper portion is opened between said gas supply passage and said lead-out passage, and
gas supplied from said gas supply passage and liquid introduced from said liquid introduction passage are mixed to form liquid droplets and the liquid droplets are lead out via said lead-out passage.

9. The two-fluid nozzle for cleaning substrates as set forth in claim 1,
wherein said injection port is formed with a vertical cross-sectional shape of an exit side periphery having a right angle or an acute angle.

10. A substrate cleaning apparatus, comprising:
a two-fluid nozzle for cleaning substrates as set forth in claim 1;
a spin chuck for holding a substrate substantially horizontally; and
a drive mechanism for moving said two-fluid nozzle for cleaning substrates above the substrate.

11. The two-fluid nozzle for cleaning substrates as set forth in claim 3,
wherein the cross-sectional area Sc of the exit of said gas supply passage is 1.13 mm$^2$ to 6.16 mm$^2$.

* * * * *